(12) United States Patent
Singla et al.

(10) Patent No.: US 11,757,468 B2
(45) Date of Patent: Sep. 12, 2023

(54) SOFT DATA COMPRESSION FOR NON-VOLATILE MEMORY

(71) Applicant: SANDISK TECHNOLOGIES LLC, Addison, TX (US)

(72) Inventors: Nihal Singla, Punjab (IN); A Harihara Sravan, Karnataka (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 167 days.

(21) Appl. No.: 17/334,688

(22) Filed: May 29, 2021

(65) Prior Publication Data

US 2022/0091752 A1 Mar. 24, 2022

(30) Foreign Application Priority Data

Sep. 24, 2020 (IN) ............... 202041041472

(51) Int. Cl.
  *H03M 7/46* (2006.01)
  *H03M 7/30* (2006.01)
  *G06F 3/06* (2006.01)
  *H03M 7/42* (2006.01)

(52) U.S. Cl.
  CPC ......... *H03M 7/6011* (2013.01); *G06F 3/0659* (2013.01); *H03M 7/42* (2013.01)

(58) Field of Classification Search
  CPC .... H03M 7/6011; H03M 7/42; H03M 7/6047; H03M 7/46; G06F 3/0659
  USPC ............................................. 341/50, 51, 63
  See application file for complete search history.

(56) References Cited

U.S. PATENT DOCUMENTS

| | | | | |
|---|---|---|---|---|
| 7,290,184 B2* | 10/2007 | Bruner | ............... | G11B 20/1866 714/704 |
| 8,615,703 B2* | 12/2013 | Eisenhuth | ......... | H03M 13/1515 714/784 |
| 9,411,675 B2* | 8/2016 | Eisenhuth | ........... | H03M 13/152 |
| 10,740,173 B2* | 8/2020 | Eisenhuth | ........... | G06F 11/1012 |
| 11,393,510 B2* | 7/2022 | Suhler | ................. | G06F 12/0804 |
| 2011/0093761 A1* | 4/2011 | Eldredge | ............. | G06F 12/0246 711/E12.008 |
| 2011/0302475 A1* | 12/2011 | Eisenhuth | ......... | H03M 13/1515 714/763 |
| 2012/0278684 A1* | 11/2012 | Eldredge | ............. | G06F 12/0246 711/170 |
| 2014/0082454 A1* | 3/2014 | Eisenhuth | ............... | G06F 11/10 714/763 |
| 2016/0314039 A1* | 10/2016 | Eisenhuth | ........... | H03M 13/256 |

* cited by examiner

*Primary Examiner* — Jean B Jeanglaude
(74) *Attorney, Agent, or Firm* — Morgan, Lewis & Bockius LLP

(57) ABSTRACT

An encoder of a storage medium encodes data subject to a read operation specified by a storage controller by generating a plurality of symbols representing a soft data stream corresponding to the data subject to the read operation, where each symbol of the plurality of symbols includes (i) a single-bit value number indicating whether the symbol counts 0s or 1s, and (ii) an N-bit count number indicating a bit count associated with the symbol, where N is greater than or equal to two, and the encoder of the storage medium is configured to convey the plurality of generated symbols to the storage controller via electrical interface circuitry connecting the storage medium and the storage controller.

20 Claims, 15 Drawing Sheets

| Symbol Width | Best Case | Worst Case | Variation Between Best/Worst Case | Compression Rate for Best Case |
|---|---|---|---|---|
| 2 bit | 10.66 KB | 32 KB | 66.68% | 33.375% |
| 4 bit | 4.27 KB | 64 KB | 93.32% | 73.3125% |
| 8 bit | 0.5 KB | 128 KB | 99.60% | 96.875% |

Figure 10

Look Up Table
| Input | Symbol (4-bit) |
|---|---|
| 1 | 0 |
| 10 | 1 |
| 100 | 2 |
| 1000 | 3 |
| 10000 | 4 |
| 100000 | 5 |
| 1000000 | 6 |
| 10000000 | 7 |
| 100000000 | 8 |
| 1000000000 | 9 |
| 10000000000 | 10 |
| 100000000000 | 11 |
| 1000000000000 | 12 |
| 10000000000000 | 13 |
| 100000000000000 | 14 |
| 000000000000000 | 15 |
Figure 11A
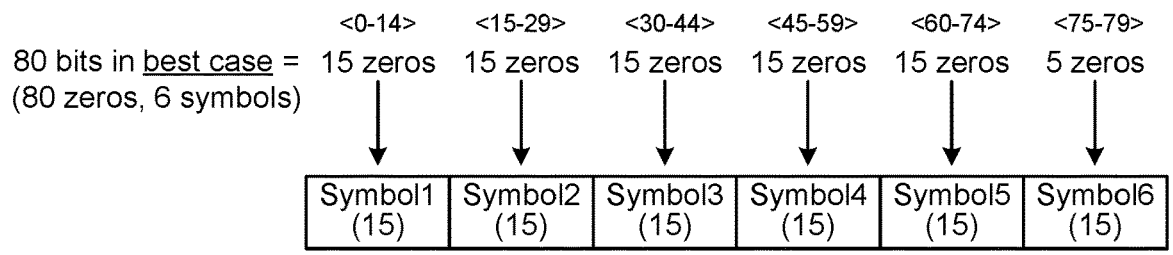
Figure 11B
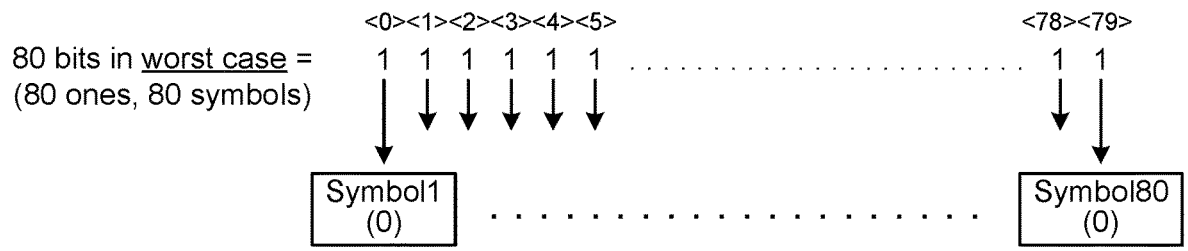
Figure 11C

Look Up Table 1500
(with 4-bit input raw data)

| S.NO | 4-bit Input LSB<0:3>MSB | Flag1 / Symbol1 | Flag2 / Symbol2 |
|---|---|---|---|
| 0 | 0000 | X / 0,0 | 0 / 0,4 |
| 1 | 1000 | 1 / 1,0 | 0 / 0,3 |
| 2 | 0100 | 1 / 1,1 | 0 / 0,2 |
| 3 | 1100 | 1 / 0,2 | 1 / 0,0 |
| 4 | 0010 | 1 / 1,2 | 0 / 0,1 |
| 5 | 1010 | 1 / 0,1 | 1 / 0,1 |
| 6 | 0110 | 1 / 0,0 | 1 / 0,2 |
| 7 | 1110 | 1 / 0,3 | X / 0,0 |
| 8 | 0001 | 1 / 1,3 | X / 0,0 |
| 9 | 1001 | 1 / 1,0 | 1 / 1,2 |
| 10 | 0101 | 1 / 1,1 | 1 / 1,1 |
| 11 | 1101 | 1 / 0,2 | 0 / 1,1 |
| 12 | 0011 | 1 / 1,2 | 1 / 1,0 |
| 13 | 1011 | 1 / 0,1 | 0 / 1,2 |
| 14 | 0111 | 1 / 0,0 | 0 / 1,3 |
| 15 | 1111 | X / 1,0 | 0 / 1,4 |

| Flag = 0 | |
|---|---|
| 0,_ | Number of 0s |
| 1,_ | Number of 1s |

| Flag = 1 | |
|---|---|
| 0,_ | 0 occurs after _ 1s |
| 1,_ | 1 occurs after _ 0s |

- 0 : Intermediate Symbol
- 1 : Final Symbol
- X : Not Used

Figure 15

|  | 4-bit symbol without symbol reduction | 4-bit symbol with symbol reduction | 2-bit symbol without symbol reduction |
|---|---|---|---|
| Best Case | 0000 | 0000, 1111 | 0000 |
| Worst Case | 1111 | 1100, 1010, 0110, 1001, 0101, 0011 | 1111 |
| 16KB page compressed to... (in best case) | 4.27KB | 9.14KB | 10.66KB |
| 16KB page compressed to... (in worst case) | 64KB | 32KB | 32KB |
| Variation btw best/worst case | 93.32% | 71.43% | 66.68% |
| Compression rate (in best case) | 73.31% | 42.86% | 33.38% |

SOFT DATA COMPRESSION FOR NON-VOLATILE MEMORY

TECHNICAL FIELD

The present disclosure relates to data storage systems, and, in particular, to a data compression technique involving soft data being read from a storage medium of a data storage system.

BACKGROUND

Non-volatile memories, such as flash memory devices, have supported the increased portability of consumer electronics, and have been utilized in relatively low power enterprise storage systems suitable for cloud computing and mass storage. The ever-present demand for almost continual advancement in these areas is often accompanied by demand to improve data storage capacity. The demand for greater storage capacity, in turn, stokes demand for greater performance (e.g., quicker reads and writes), so that the addition of storage capacity does not slow down the memory device. As such, there is ongoing pressure to increase the capacity and the operating speed of non-volatile memories in order to further improve the useful attributes of such devices.

SUMMARY

This application describes various systems and methods for compressing a soft data stream associated with a read request for transmission at an interface between a storage controller and a storage medium.

In one aspect, a data storage system comprises a storage medium including a plurality of memory cells and an encoder; a storage controller in communication with the storage medium; and electrical interface circuitry configured to transfer data via a channel disposed between the storage medium and the storage controller.

The encoder of the storage medium is configured to: receive data subject to a read operation specified by the storage controller; encode the data subject to the read operation including generating a plurality of symbols representing a soft data stream corresponding to the data subject to the read operation; and convey the plurality of generated symbols to the storage controller via the electrical interface circuitry.

Each symbol of the plurality of symbols representing the soft data stream includes: (i) a single-bit value number indicating whether the symbol counts 0s or 1s, and (ii) an N-bit count number indicating a bit count associated with the symbol, where N is greater than or equal to two.

In some implementations, for each symbol of the plurality of symbols: if the value number is 1, the count number indicates a number of 0s preceding a 1; and if the value number is 0, the count number indicates a number of is preceding a 0.

In some implementations, the encoder is configured to generate symbols for a plurality of combinations of N+1 bits of the data subject to the read operation based on a lookup table stored at the storage medium.

In some implementations, the lookup table respectively maps each combination of N+1 bits to two symbols.

In some implementations, the lookup table respectively maps: at least one of the plurality of combinations of N+1 bits to an intermediate symbol and a final symbol; and at least one of the plurality of combinations of N+1 bits to two final symbols in the lookup table.

In some implementations, the encoder is configured to combine an intermediate symbol of one of the plurality of combinations of N+1 bits with a final symbol of another of the plurality of combinations of N+1 bits before conveying the plurality of generated symbols to the storage controller.

In some implementations, the electrical interface circuitry includes a first-in-first-out (FIFO) buffer configured to buffer the plurality of generated symbols; and the encoder is configured to convey the plurality of generated symbols via the buffer.

Various implementations of systems and methods within the scope of the appended claims each have several aspects, no single one of which is solely responsible for the desirable attributes described herein. Without limiting the scope of the appended claims, some prominent features are described. After considering this discussion, and particularly after reading the section entitled "Detailed Description," one will understand how the features of various implementations are used to improve performance at the interface in a tunable and scalable manner.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 10 depicts relationships between (i) symbol bit width and code length variations for best and worst case scenarios, and (ii) symbol bit width and compression rates in accordance with some implementations.

FIG. 11A is an example look up table that the control circuitry 310 may use for performing the encoding scheme 800 in accordance with some implementations.

FIG. 11B depicts a best-case scenario for the run-length encoding scheme 800 in accordance with some implementations.

FIG. 11C depicts a worst-case scenario for the run-length encoding scheme 800 in accordance with some implementations.

FIG. 15 is an example lookup table 1500 for use by an encoder configured to perform the encoding scheme 1300 in accordance with some implementations.

FIG. 17 is a table highlighting tradeoffs between code length variation (between best and worst case) and compression rates in accordance with some implementations.

Figure 1:
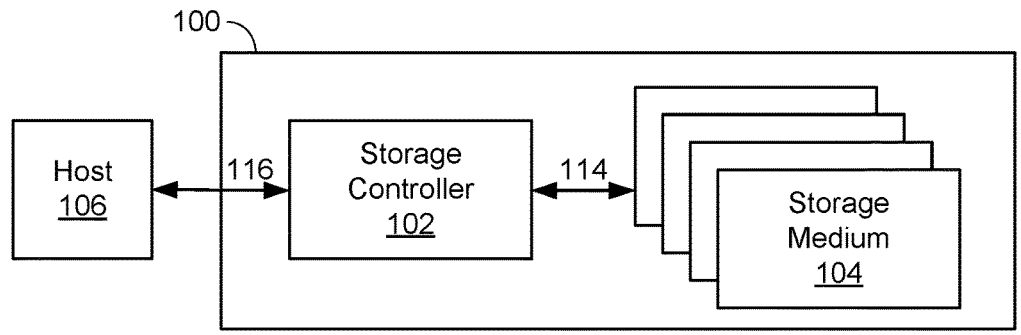
FIG. 1 is a functional block diagram of a non-volatile storage system in accordance with some implementations.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals are used to denote like features throughout the specification and figures.

DETAILED DESCRIPTION

FIG. 1 is a functional block diagram of a non-volatile storage system in accordance with some implementations. Storage system 100 includes a storage controller 102 (sometimes referred to as a flash memory controller) and non-volatile memory that may be made up of one or more storage mediums 104 (sometimes referred to as memory dies). As used herein, the term storage medium (or memory die) refers to a plurality of non-volatile memory cells (e.g., one or more memory arrays), and associated circuitry (e.g., peripheral circuitry) for managing the physical operation of the non-volatile memory cells. In some implementations, the memory cells and associated circuitry are formed on a single semiconductor substrate. Storage controller 102 interfaces with a host system 106 (also referred to as a host) and transmits command sequences for read, program, and erase operations to storage medium(s) 104. Throughout this disclosure, reference may be made to a single storage medium 104. However, it should be understood that such features may additionally or alternatively be implemented across a plurality of storage mediums 104.

The storage controller 102 manages data stored on one or more storage mediums 104 (e.g., flash memory) and communicates with a host 106, such as a computer or electronic device. The storage controller 102 can have various functionality in addition to the specific functionality described herein. For example, the storage controller 102 can format the storage medium 104 to ensure the memory is operating properly, map out bad memory cells, and allocate spare memory cells to be substituted for future failed memory cells. Some part of the spare memory cells can be used to hold firmware to operate the storage controller 102 and implement other features.

In operation, when the host 106 needs to read data from or write data to a storage medium 104, the host 106 communicates with the storage controller 102. If the host 106 provides a logical address to which data is to be read/written, the storage controller 102 may convert the logical address received from the host 106 to a physical address in the storage medium 104. Alternatively, the host 106 may provide the physical address. The storage controller 102 may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The storage medium(s) 104 may include any suitable non-volatile storage medium, including NAND flash memory cells and/or NOR flash memory cells. The memory cells can take the form of solid-state (e.g., flash) memory cells and can be one-time programmable, few-time programmable, or multi-time programmable. The memory cells can also be single-level cells (SLC), multiple-level cells (MLC), triple-level cells (TLC), quad-level cells (QLC), or use other memory cell level technologies. Also, the memory cells can be fabricated in a two-dimensional or three-dimensional fashion.

The interface between the storage controller 102 and the storage medium(s) 104 may be any suitable flash interface, such as Toggle Mode or Open NAND Flash Interface (ONFI).

In some implementations, storage system 100 may be a card-based system, such as a secure digital (SD) or a micro secure digital (micro-SD) card. In some implementations, storage system 100 may be part of an embedded storage system. For example, the storage controller 102 and storage medium(s) 104 may be embedded within the host 106, such as in the form of a solid-state disk (SSD) drive installed in a computer. Such an SSD may emulate, replace, or be used instead of a hard disk drive inside the host 106, or be used as a NAS device, and so forth. In any case, such an SSD need not be made to work as a hard drive.

Although in the example illustrated in FIG. 1, storage system 100 includes a single channel between storage controller 102 and storage medium 104, the subject matter described herein is not limited to having a single memory channel. For example, in some storage system architectures, two, four, eight, or more channels may exist between the storage controller 102 and the storage medium(s) 104, depending on controller capabilities. In any of the implementations described herein, a plurality of channels may exist between the storage controller 102 and the storage medium(s) 104, even if a single channel is depicted in the drawings.

In some implementations, an intermediate storage controller (not shown) may interface the host 106 with the storage controllers 102 of a plurality of storage systems 100. The interface between the intermediate storage controller and the plurality of storage systems 100 may be a bus interface, such as a serial advanced technology attachment (SATA) or peripheral component interface express (PCIe) interface. The plurality of storage systems 100 may be implemented in a solid state drive (SSD), such as found in portable computing devices, such as laptop computers, tablet computers, or mobile devices.

In some implementations, a plurality of intermediate storage controllers (not shown) may respectively interface the host 106 with the storage controllers 102 of a plurality of storage systems 100. Such a system may be referred to as a hierarchical storage system. The host 106 may access memories within the storage systems 100 via a bus interface. In some implementations, the bus interface may be an NVMe or fiber channel over Ethernet (FCoE) interface. In some implementations, a hierarchical storage system may be a rack mountable mass storage system that is accessible by multiple host 106 computers, such as would be found in a data center or other location where mass storage is needed.

Figure 2:
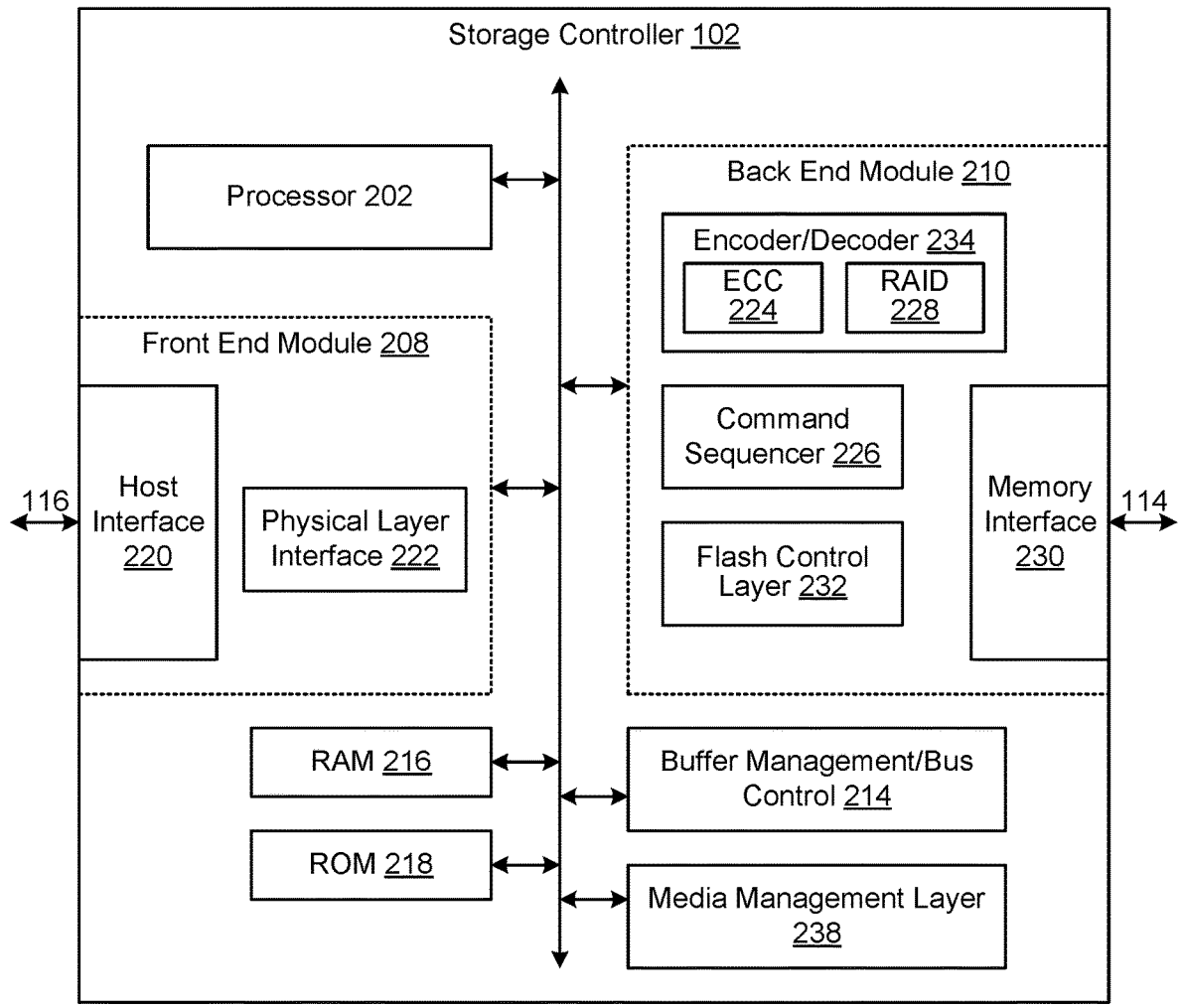
FIG. 2 is a functional block diagram of an example storage controller 102 of the storage system 100 in accordance with some implementations.

FIG. 2 is a functional block diagram of an example storage controller 102 of the storage system 100 in accordance with some implementations. Storage controller 102 includes a front-end module 208 that interfaces with a host 106, a back-end module 210 that interfaces with one or more non-volatile storage mediums 104, and various other modules that perform functions described herein.

The storage controller 102 can take the form of processing circuitry, a microprocessor or processor, and a non-transitory computer-readable medium that stores computer-readable program code (e.g., firmware) executable by the (micro) processor, logic gates, switches, an application specific integrated circuit (ASIC), a programmable logic controller, and/or an embedded microcontroller, for example. Storage controller 102 can be configured with hardware and/or firmware to perform the various functions described herein. Also, some of the components shown as being internal to the storage controller 102 (e.g., RAM 216 and ROM 218) can also be stored external to the storage controller 102, and other components can be used. Additionally, the phrase "operatively in communication with" could mean directly in communication with or indirectly (wired or wireless) in communication with through one or more components, which may or may not be shown or described herein.

The components of storage controller 102 depicted in FIG. 2 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function or related functions, or a self-contained hardware or software component that interfaces with a larger system. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for storage controller 102 to perform the functions described herein.

The storage controller 102 may include a buffer manager/bus controller 214, configured to manage buffers in random access memory (RAM) 216 and control the internal bus arbitration of the storage controller 102. A read only memory (ROM) 218 may store system boot code. Although illustrated in FIG. 2 as located within the storage controller 102, in some implementations one or both of the RAM 216 and ROM 218 may be located separately from the storage controller 102. In yet other implementations, portions of RAM 216 and ROM 218 may be located both within the storage controller 102 and outside the storage controller 102. Further, in some implementations, the storage controller 102, RAM 216, and ROM 218 may be located on separate semiconductor dies.

The storage controller 102 may include one or more processors 202 configured to control the overall operation of the storage controller 102. The processor 202 may issue commands to control circuitry 310 (FIG. 3) of storage medium 104, or to any other component of storage medium 104, via memory interface 230. In some implementations, the ROM 218 and/or RAM 216 may comprise code such as a set of instructions, and the processor 202 may be operable to execute the set of instructions to provide the functionality described herein. Additionally or alternatively, the processor 202 may access code from a portion of the memory array 350 (FIG. 3) in the storage medium 104, such as a reserved area of memory cells connected to one or more word lines.

The front-end module 208 includes a host interface 220 that provides a communication interface with the host 106. The choice of the type of host interface 220 can depend on the type of memory being used. Examples of host interfaces include, but are not limited to, SATA, SATA Express, SAS, Fibre Channel, USB, PCIe, and NVMe. The host interface 220 is a communication interface that facilitates transfer for data, control signals, and timing signals. The host interface 220 may include electrical interface circuitry that provides a physical connection to the channel(s) 116 connecting the storage controller 102 to the host. This electrical interface circuitry may be part of the host interface 220, or may be separately described as a physical layer interface 222.

In some implementations, the host interface 220, in communication with ROM 218, RAM 216, and/or processor 202, may be an electrical circuit that provides an electrical interface between the storage controller 102 and the host 106. For example, the host interface 220 may change the format or timing of signals, provide a buffer, isolate from surges, latch I/O, and so forth. Commands and data from the host 106 are received by the storage controller 102 via the host interface 220. Data sent to the host 106 is transmitted via the host interface 220.

The back-end module 210 includes a memory interface 230 that provides command sequences and data (to be written) to storage medium(s) 104 and receives status information and data (that was read) from storage medium(s) 104. In some implementations, the memory interface 230 may be a double data rate (DDR) interface such as Toggle Mode or ONFI.

In some implementations, the memory interface 230, in communication with ROM 218, RAM 216, and/or processor 202, may be an electrical circuit that provides an electrical interface between the storage controller 102 and the storage medium 104. For example, the memory interface 230 may change the format or timing of signals, provide a buffer, isolate from surges, latch I/O, and so forth.

The back-end module 210 may include an error correction controller (ECC) engine 224 and/or a Redundant Array of Independent Dies (RAID) module 228. The ECC engine 224 may be configured to encode data received from the host 106, and decode and error correct data read from the storage medium 104. The RAID module 228 may be configured to manage generation of RAID parity and recovery of failed data. The RAID parity may be used as an additional level of integrity protection for the data being written into the storage medium 104.

In some implementations, the RAID module 228 may be a part of the ECC engine 224. The RAID parity may be added as an extra die or dies as implied by the common name, but it may also be added within the existing die, e.g., as an extra plane, or extra block, or extra WLs within a block. ECC engine 224 and RAID module 228 may both calculate redundant data that can be used to recover when errors occur and may be considered examples of redundancy encoders. Together, ECC engine 224 and RAID module 228 may be considered to form a combined redundancy encoder/decoder 234.

The back-end module 210 may include a command sequencer 226, and/or a flash control layer 232. The command sequencer 226 may generate command sequences, such as program and erase command sequences, for transmission to storage medium 104. The flash control layer 232 may control the overall operation of the back-end module 210.

The storage controller 102 may include a media management layer 238, which performs wear leveling of memory cells of storage medium 104. The storage controller 102 may also include other discrete components (not shown), such as external electrical interfaces, external RAM, resistors, capacitors, or other components that may interface with storage controller 102. In some implementations, one or more of the physical layer interface 222, RAID module 228, media management layer 238 and buffer management/bus controller 214 are optional components that are not necessary in the storage controller 102.

The Flash Translation Layer (FTL) or Media Management Layer (MML) 238 may be integrated as part of the flash management that may handle flash errors and interfacing with the host 106. In particular, the MML 238 may be a module in flash management and may be responsible for the internals of NAND management. In particular, the MML 238 may include an algorithm in the storage device firmware which translates writes from the host 106 into writes to the storage medium 104.

The MML 238 may be needed because: 1) storage medium 104 may have limited endurance; 2) storage medium 104 may only be written in multiples of pages; and/or 3) a selected portion of memory cells of the storage medium 104 may not be written unless it is erased as a block (i.e. a block may be considered to be a minimum unit of erase and such a non-volatile memory may be considered a block-erasable non-volatile memory). The MML 238 may address these potential limitations of the storage medium 104 which may not be visible to the host 106. Accordingly, the MML 238 may translate write operations received from the host 106 into write operations for transmission to the storage medium 104.

Figure 3:
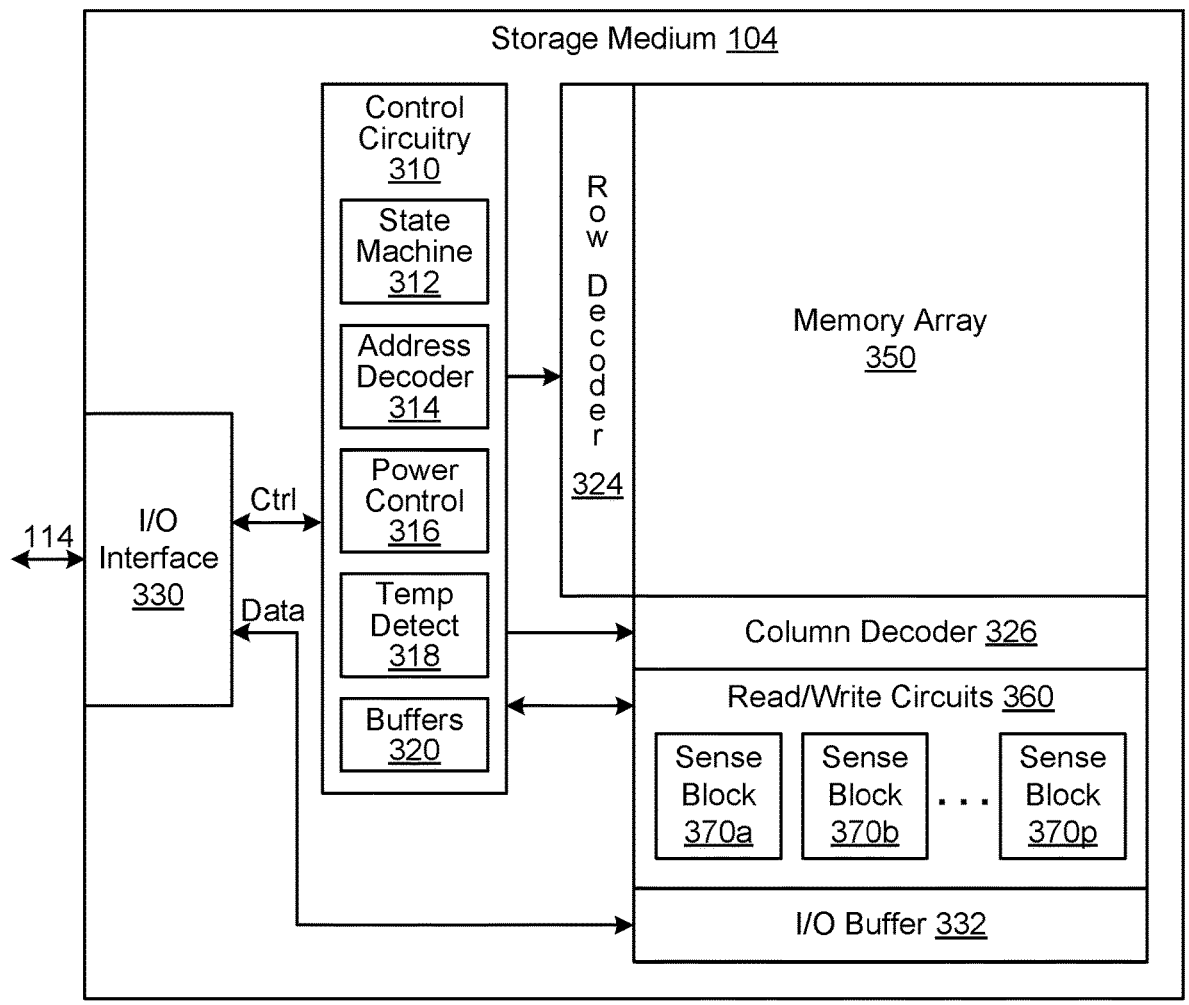
FIG. 3 is a functional block diagram of an example storage medium 104 of the storage system 100 in accordance with some implementations.

FIG. 3 is a functional block diagram of an example storage medium 104 of the storage system 100 in accordance with some implementations. Storage medium 104 includes a memory array 350 including a plurality of memory cells, control circuitry 310, read/write circuits 360, and an input/output (I/O) interface 330.

In some implementations, a storage controller 102 (as described above with reference to FIG. 2) may included in the same storage device (e.g., a removable storage card) as the storage medium(s) 104. However, in other implementations, the storage controller 102 may be separated from the storage medium(s) 104. In some implementations, the storage controller 102 may be disposed on a different die than the storage medium 104. In some implementations, one storage controller 102 may communicate with a plurality of storage mediums 104. In some implementations, each storage medium 104 may have its own storage controller 102.

Commands and data may be transferred between the host 106 and the storage controller 102 via a data bus 116, and between the storage controller 102 and storage medium(s) 104 via an interface channel 114. In some implementations, the I/O interface 330 includes a set of I/O pins (also referred to as pads) that connect to respective communication lines of the interface channel 114. The I/O interface 330 may be connected to the control circuitry 310, row decoder 324, column decoder 326, read/write circuits 360, and/or memory array 350.

The I/O interface 330 may be a synchronous interface or an asynchronous interface. Examples of an I/O interface include a Toggle Mode Interface and an Open NAND Flash Interface (ONFI). Other I/O interfaces can also be used. Toggle mode (e.g., Toggle Mode 2.0 JEDEC Standard or Toggle Mode 900) is an asynchronous memory interface that supports SDR and DDR with a DQS signal acting as a data strobe signal.

Data received at the I/O interface 330 for writing to the memory array 350 (in accordance with a write command) is latched in an I/O buffer 332 before being written to the memory array 350. Similarly, data that is read from the memory array 350 (in accordance with a read command) is latched in the I/O buffer 332 before being transmitted to the storage controller 102 via the I/O interface 330. The I/O buffer 332 may be included in the I/O interface 330 or otherwise communicatively coupled to the I/O interface 330. The I/O buffer 332 includes a plurality of data latches. In some implementations, the data latches are arranged in groups of 8 (XDL0 through XDL7) or 16 (XDL0 through XDL15), depending on how many bits the I/O interface 330 is configured to receive or transmit at a time.

The read/write circuits 360 include multiple sense blocks 370 including 370a through 370p (sensing circuitry) and allow a page (or multiple pages) of data in multiple memory cells of the memory array 350 to be read or programmed (written) in parallel. In some implementations, each sense block 370 includes one or more sense amplifiers connected to respective bit lines of the memory array 350. The sense amplifiers sense voltage signals associated with selected memory cells (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Each bit line of the memory array 350 is coupled to a sense block 370, each of which includes one or more sense amplifiers. The sense amplifiers sense voltages on each bit line in accordance with read operations. The sense amplifiers sense the low power signals from respective bit lines that represents data bits (1 or 0) stored in respective memory cells. The sense amplifiers amplify small voltage swings to recognizable logic levels so the data can be interpreted properly by logic outside the memory array (e.g., storage controller 102). After a sense amplifier for a particular bit line amplifies the sensed voltage to a normal logic level, the bit from the desired cell is then latched from the cell's sense amplifier into a data latch in the I/O buffer 332, and transferred to the storage controller 102 on data lines DQ of the output bus 114.

The sense amplifiers sense data read onto corresponding bit lines from a plurality of memory cells associated with the corresponding bit lines. The sense amplifiers may include bit line drivers for applying a voltage to corresponding bit lines in accordance with write data. The sense amplifier for a given bit line or group of bit lines may directly control the bit line(s). In data reading, the read/write circuits 360 may apply a strobe signal to a given sense amplifier. The sense amplifier determines data at the assertion timing of the strobe signal (e.g., an ON state of a memory cell may be defined as data "0", and an off state may be defined as data "1"). This data may be held in an internal latch SADL of the sense amplifier before being transferred to one of the data latches of the I/O buffer 332.

Input and output of data to and from the sense amplifiers are performed via the data latches of the I/O buffer 332. That is, data received from the storage controller 102 is transferred to sense amplifiers via the data latches. In addition, data in the sense amplifiers (in internal latches of the sense amplifiers) is transmitted to the storage controller 102 via the data latches. The data latches of the I/O buffer 332 may function as the cache memory of the storage medium 104.

The control circuitry 310 cooperates with the read/write circuits 360 to perform memory operations (e.g., write, read, erase, and others) on the memory array 350. In some implementations, control circuitry 310 includes a state machine 312, an on-chip address decoder 314, a power control circuit 316, a temperature detection circuit 318, and/or buffers 320.

The state machine 312 provides die-level control of memory operations. In some implementations, the state machine 312 is programmable by software. In other implementations, the state machine 312 does not use software and is completely implemented in hardware (e.g., electrical circuits). In some implementations, the state machine 312 can be replaced by a microcontroller or microprocessor.

The address decoder 314 provides an address interface between addresses used by the host 106 or storage controller 102 to the hardware address used by the decoders 324 and 326.

The power control module 316 controls the power and voltages supplied to the word lines and bit lines during memory operations. It can include drivers for word line layers (discussed below) in a 3D configuration, select transistors (e.g., SGS and SGD transistors, described below) and source lines. Power control module 316 may include charge pumps for creating voltages.

The temperature detection circuit 318 may be configured to detect temperature in or around the storage medium 104. The temperature detection circuit 318 may include an on-chip temperature sensor.

The buffers 320 may be registers, ROM fuses, and/or other storage devices for storing default values such as base voltages and other parameters.

Any one or any combination of control circuitry 310, state machine 312, decoders 314/324/326, temperature detection circuit 318, power control module 316, sense blocks 370, read/write circuits 360, and storage controller 102 can be considered one or more control circuits (or managing circuitry, or peripheral circuitry) that performs the functions described herein.

The memory array 350 may be addressable by word lines via a row decoder 324 and by bit lines via a column decoder 326. The memory array 350 may comprise one or more 2D or 3D arrays of memory cells. The memory array 350 may comprise a monolithic 3D memory array in which multiple memory levels are formed above (and not in) a single substrate, such as a wafer, with no intervening substrates. The memory array 350 may comprise any type of non-volatile memory that is monolithically formed in one or more physical levels of arrays of memory cells having an active area disposed above a silicon substrate. The memory array 350 may be in a non-volatile memory device having circuitry associated with the operation of the memory cells, whether the associated circuitry is above or within the substrate.

Multiple memory elements in memory array 350 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. In some implementations, the non-volatile memory cells of memory array 350 comprise vertical NAND strings with charge-trapping material. In such a configuration, a NAND string includes memory cells connected by a channel.

A NAND flash memory array 350 may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array 350 may be arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory array 350 may be vertically arranged as a stack of multiple two-dimensional memory device levels. As another non-limiting example, a three-dimensional memory array 350 may be arranged as multiple vertical columns (e.g., columns extending substantially perpendicular to the major surface of the substrate, i.e., in the y direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of a non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

In some implementations, the memory array 350 comprises a two dimensional memory array of non-volatile memory cells. In one example, the non-volatile memory cells are NAND flash memory cells utilize floating gates. Other types of memory cells (e.g., NOR-type flash memory) can also be used.

The exact type of memory array architecture or memory cells included in the memory array 350 is not limited to the examples above. Many different types of memory array architectures or memory cell technologies can be used to form the memory array 350. No particular non-volatile memory technology is required for purposes of the implementations described herein. Other examples of suitable technologies for memory cells of the memory array 350 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of the memory array 350 include two dimensional arrays, three dimensional arrays, cross-point arrays, stacked two dimensional arrays, vertical bit line arrays, and the like.

A person of ordinary skill in the art will recognize that the technology described herein is not limited to a single specific memory array, but covers many relevant memory arrays within the spirit and scope of the technology as described herein and as understood by one of ordinary skill in the art.

Figure 4:
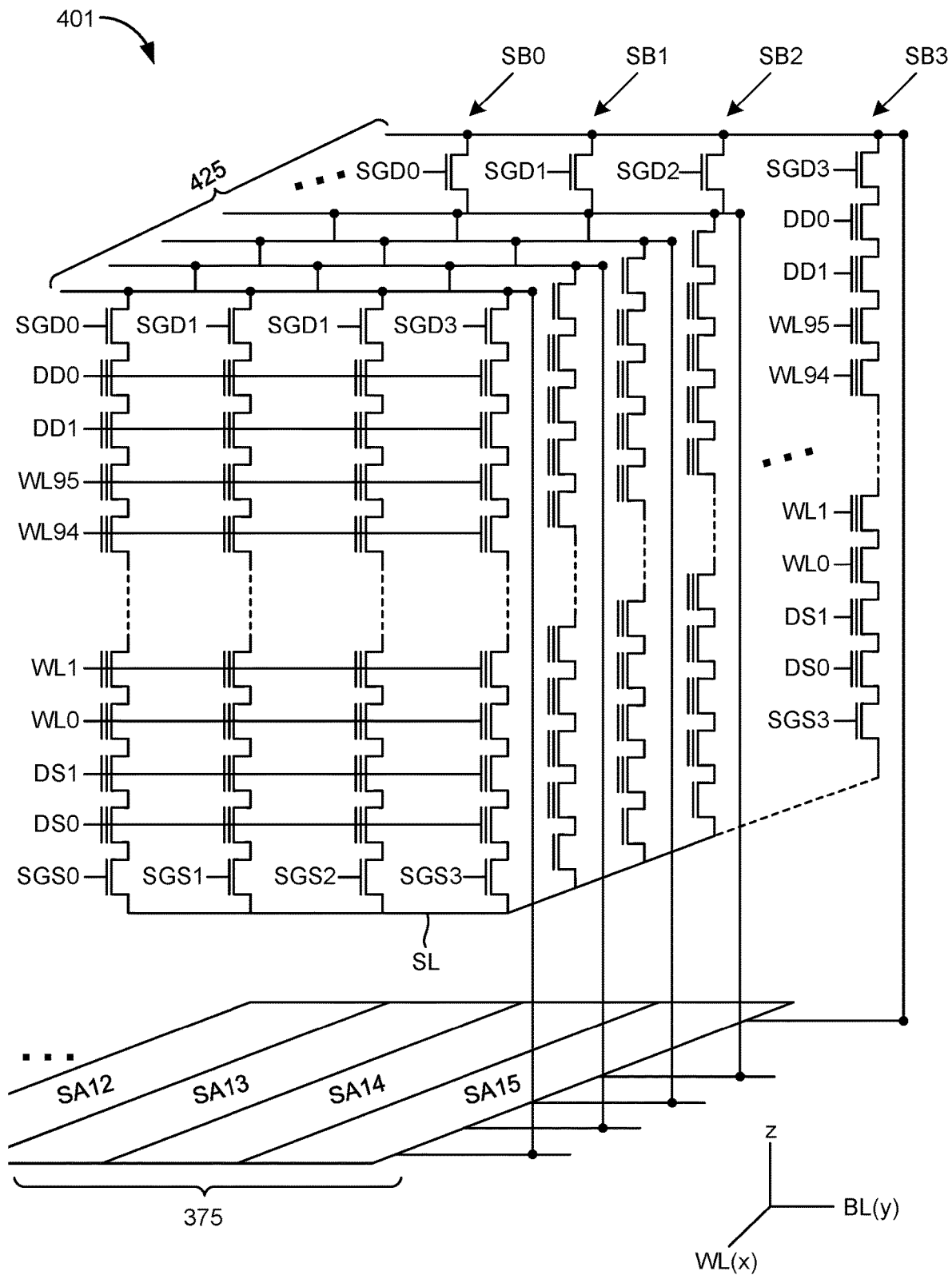
FIG. 4 is a schematic diagram of a portion of the memory array 350 depicted in FIG. 3 in accordance with some implementations.

FIG. 4 is a schematic diagram of a portion of the memory array 350 depicted in FIG. 3 in accordance with some implementations. FIG. 4 shows physical word lines WL0-WL95 running across the entire block. Within the block, each bit line 425 is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Each bit line 425 is connected to sense amplifiers in the peripheral circuitry of the storage medium 104 (e.g., in sense blocks 370 of the read/write circuits 360). The sense amplifiers sense voltage signals associated with selected memory cells of the respective NAND strings corresponding to each bit line (e.g., determining whether a given memory cell is conducting current during a sense operation, or how much current the given memory cell conducts during the sense operation). The sense amplifiers then amplify the sensed voltages to levels that are optimized for the I/O circuitry of the storage medium 104, interface channel 114, and storage controller 102.

Memory cells in the various implementations of the memory array 350 described above can be erased, programmed, and read. At the end of a successful programming process (with verification), the threshold voltages of the memory cells should be within one or more distributions (ranges) of threshold voltages for programmed memory cells or within a distribution (range) of threshold voltages for erased memory cells, as appropriate.

Figure 5:
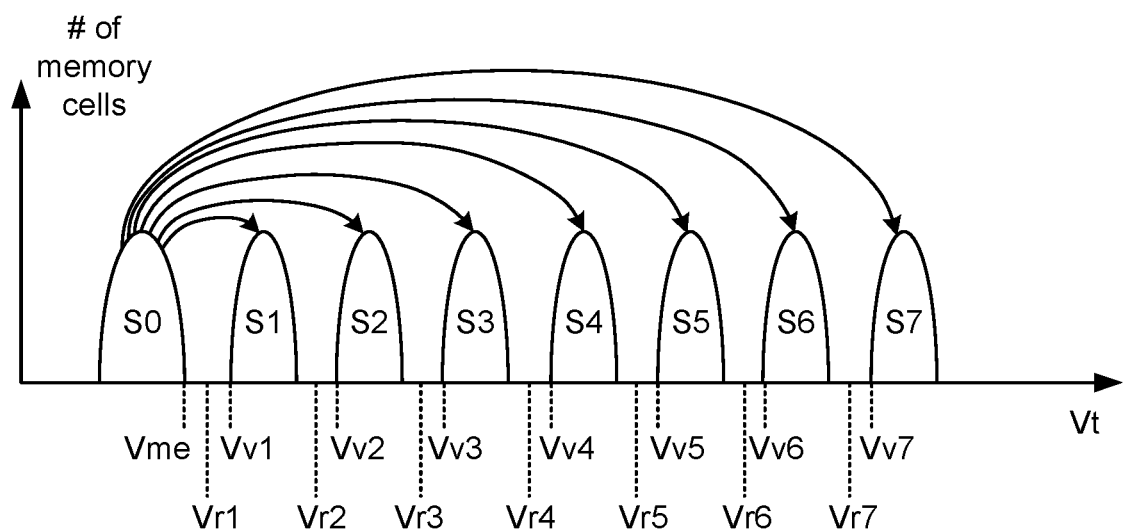
FIG. 5 illustrates example threshold voltage distributions (ranges) for TLC memory cells that store three bits of data in accordance with some implementations.

FIG. 5 illustrates example threshold voltage distributions (ranges) for TLC memory cells that store three bits of data in accordance with some implementations. Other implementations, however, may use other data capacities per memory cell (e.g., such as one, two, four, five, or more bits of data per memory cell). FIG. 5 shows eight threshold voltage distributions, corresponding to eight data states. The first threshold voltage distribution (data state) S0 represents memory cells that are erased. The system uses an erase verify reference voltage Vme to test whether the memory cells are sufficiently erased.

The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In some implementations, data values are assigned to the threshold voltage ranges using a Gray code assignment so that if the threshold voltage of a memory erroneously shifts to its neighboring data state, only one bit is affected.

FIG. 5 also shows seven read reference voltages (also referred to as read compare voltages) Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages (also referred to as program verify targets) Vv1, Vv2, Vv3, Vv4, Vv5, Vv6, and Vv7. When programming memory cells to data state S1, the system tests whether those memory cells have a threshold voltage greater than or equal to Vv1. When programming memory cells to data state S2, the system tests whether the memory cells have threshold voltages greater than or equal to Vv2. When programming memory cells to data state S3, the system determines whether memory cells have their threshold voltage greater than or equal to Vv3. When programming memory cells to data state S4, the system tests whether those memory cells have a threshold voltage greater than or equal to Vv4. When programming memory cells to data state S5, the system tests whether those memory cells have a threshold voltage greater than or equal to Vv5. When programming memory cells to data state S6, the system tests whether those memory cells have a threshold voltage greater than or equal to Vv6. When programming memory cells to data state S7, the system tests whether those memory cells have a threshold voltage greater than or equal to Vv7.

Example voltages for FIG. 5 are Vr1=0 v, Vr2=1 v, Vr3=2 v, Vr4=3 v, Vr5=4 v, Vr6=5 v, Vr7=6 v, Vv1=0.4 v, Vv2=1.4 v, Vv3=2.4 v, Vv4=3.4 v, Vv5=4.4 v, and Vv6=5.4 v, Vv7=6.4 v.

In some implementations, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7.

For example, while some memory cells are being programmed from data state S0 to data state S1, other memory cells are being programmed from data state S0 to data state S2 and/or from data state S0 to data state S3, and so on. The arrows coming from data state S0 in FIG. 5 represent the full sequence programming. The technology described herein can also be used with other types of programming in addition to full sequence programming (including, but not limited to, multiple stage/phase programming). In some implementations, data states S1-S7 can overlap, with controller 102 relying on an ECC algorithm and soft sensing (described in more detail below) to identify the correct data.

Figure 6A:
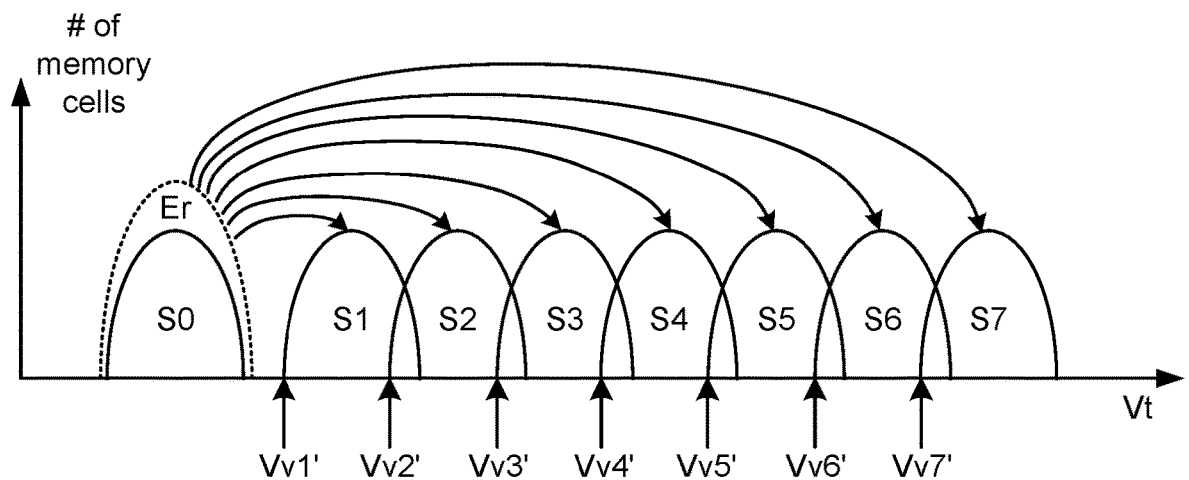
FIG. 6A depicts the first phase of a multiphase programming operation, which includes programming the memory cells from the erased state (S0) to any of the programmed data states S1-S7, similar to full sequence programming, in accordance with some implementations.

FIG. 6A depicts the first phase of a multiphase programming operation, which includes programming the memory cells from the erased state (S0) to any of the programmed data states S1-S7, similar to full sequence programming, in accordance with some implementations. However, rather than using the standard verify reference voltages (e.g., Vv1, Vv2, Vv3, Vv4, Vv5, Vv6, and Vv7), the process of FIG. 6A uses an alternate set of verify reference voltages (e.g., Vv1', Vv2', Vv3', Vv4,' Vv5', Vv6', and Vv7') that are each slightly lower than the corresponding standard verify reference voltage. Thus, the threshold voltages of FIG. 6A can be thought of as intermediate threshold voltage distributions (or intermediate data states) that are at lower voltages than the threshold voltages of FIG. 5. Note that memory cells in the erased state S0 that are to be in data state S0, are inhibited from programming.

Figure 6B:
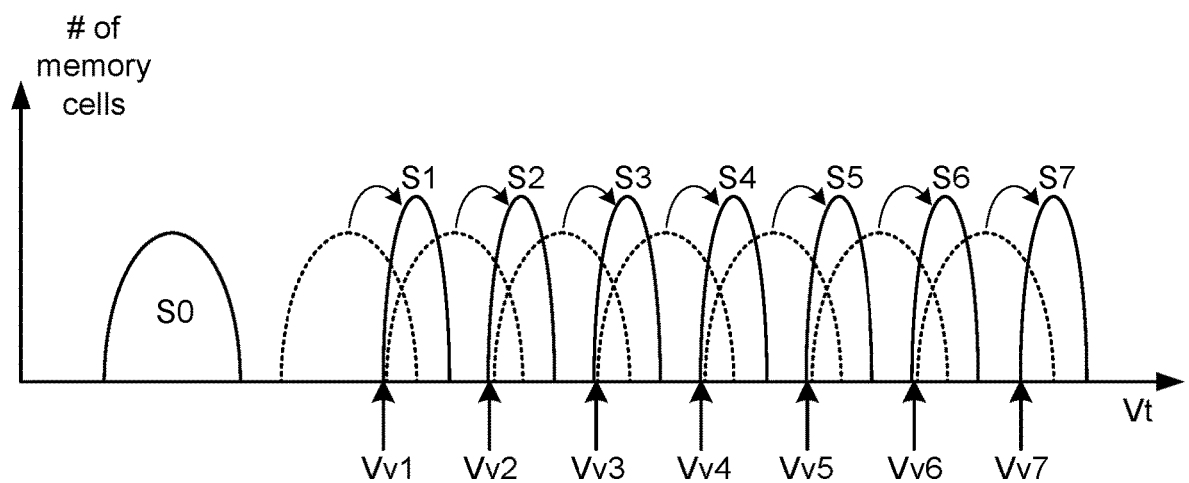
FIG. 6B depicts the second (and last) phase of the multiphase programming operation, which includes programming the memory cells to tighten (decrease the width of) the threshold distributions, in accordance with some implementations.

FIG. 6B depicts the second (and last) phase of the multiphase programming operation, which includes programming the memory cells to tighten (decrease the width of) the threshold distributions, in accordance with some implementations. Thus, the memory cells are programmed from (i) the intermediate threshold voltage distributions (or data states) of FIG. 6A using the alternate set of verify reference voltages (e.g., Vv1', Vv2', Vv3', Vv4,' Vv5', Vv6', and Vv7') to (ii) the final or target threshold voltage distributions (or data states) of FIG. 6B using the standard verify reference voltages (e.g., Vv1, Vv2, Vv3, Vv4, Vv5, Vv6, and Vv7). FIG. 6A may be referred to as the coarse, rough, foggy, or intermediate phase, and FIG. 6B may be referred to as the final, target, fine, or high-accuracy phase.

In some implementations, the coarse phase of FIG. 6A is performed for a given word line, followed by the coarse phase for the next word line. The coarse phase for the next word line could give rise to interference for the given word line, thereby widening the intermediate threshold voltage distributions, which could lead to errors when reading the data. However, the fine phase of a given word line may subsequently be performed after the coarse phase for the next word line, removing or reducing the effects of interference from the next word line. Note that memory cells in the erased state Er that are to be in data state S0 are inhibited from programming.

In some implementations, the coarse-fine program scheme is implemented in a Bit-Cost-Scalable (BiCs) architecture. FIGS. 6A and 6B depict an example in which memory cells are programmed to three bits per memory cell. In some implementations, memory cells are programmed to four bits per memory cell (referred to herein as "QLC", quad level cell). A coarse-fine program scheme can compensate for Neighbor Word line Interference ("NWI") effect significantly by reducing the threshold voltage (Vt) difference between coarse and fine. A coarse-fine program scheme may be used to program memory cells that store two, three, four, five, or more than five bits per cell.

In some implementations after performing the first programming phase depicted in FIG. 6A on a given word line, the first programming phase depicted in FIG. 6A is performed on another word line that is later in the sequence. Afterwards, the second programming phase depicted in FIG. 6B is performed on the given word line.

Figure 7A:
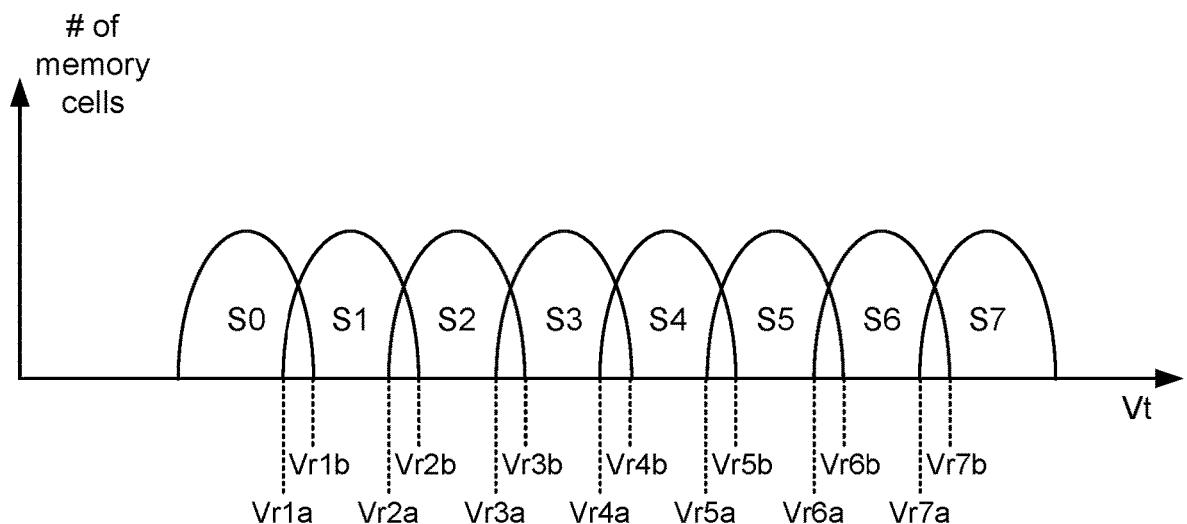
FIG. 7A illustrates example threshold voltage distributions (ranges) for TLC memory cells that store three bits of data, in which the distributions overlap in accordance with some implementations.

FIG. 7A illustrates example threshold voltage distributions (ranges) for TLC memory cells that store three bits of data, in which the distributions overlap in accordance with some implementations. The distributions in FIG. 7A may be the result of a single-phase full-sequence programming operation, or the first phase of a multiphase programming operation. Refining the distributions to minimize or eliminate overlap (e.g., by applying successive programming pulses, performing additional programming phases, and so forth) takes additional time and power. As a result, cell distributions may be left overlapping, with storage controller 102 relying on an ECC algorithm and soft sensing to identify the correct data.

In some implementations, soft sensing comprises a double sense scheme in which the overlapping portion between two neighboring distributions is subjected to two sensing operations. By comparing the threshold voltages of the memory cells being read to two read reference voltages (e.g., Vr1a and Vr1b), a cell may be determined to be completely in one of the two distributions (e.g., in S0 or S1), or within the overlapping portion of the two distributions.

Specifically, a first sensing operation may be applied using read reference voltage Vr1a and a second sensing operation may be applied using read reference voltage Vr1b in order to determine which cells are in state S0, state S1, or in the overlapping region between states S0 and S1. A first sensing operation may be applied using read reference voltage Vr2a and a second sensing operation may be applied using read reference voltage Vr2b in order to determine which cells are in state S1, state S2, or in the overlapping region between states S1 and S2, and so forth.

Figure 7B:
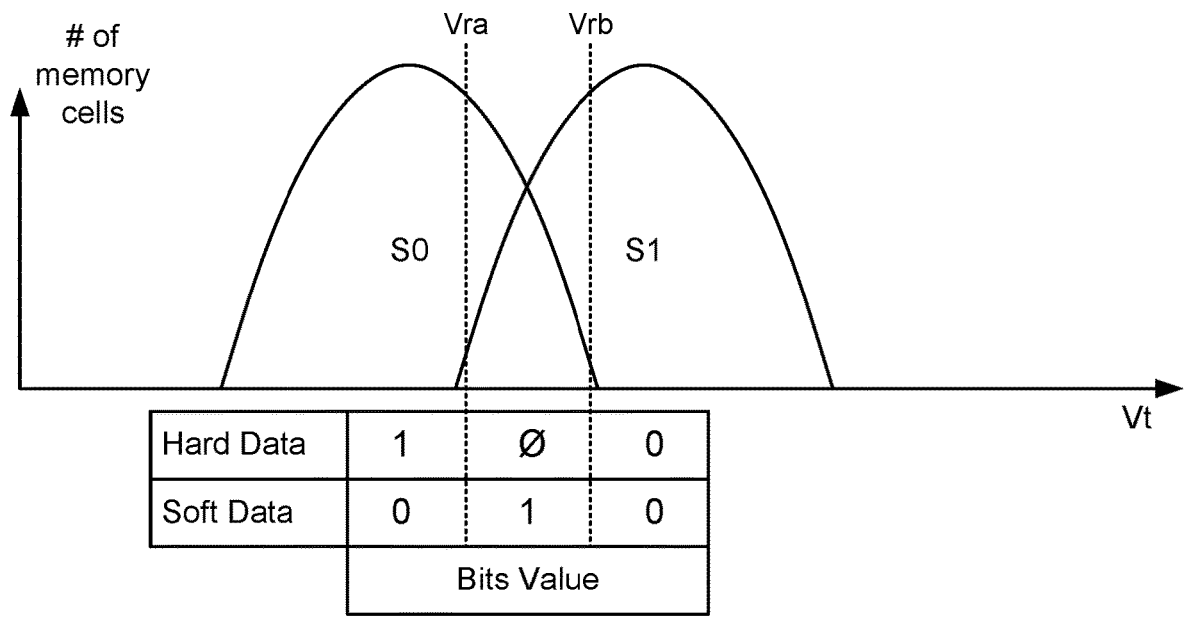
FIG. 7B illustrates a soft sensing coding scheme in accordance with some implementations.

FIG. 7B illustrates a soft sensing coding scheme in accordance with some implementations. In two neighboring distributions (e.g., representing data states S0 and S1), a first sensing operation may be applied using read reference voltage Vra and a second sensing operation may be applied using read reference voltage Vrb in order to determine which cells are in state S0, which cells are in state S1, and which cells are in the overlapping region between states S0 and S1.

Memory cells having threshold voltages that are completely in distribution S0 (less than Vra) and distribution S1 (greater than Vrb) may be represented by hard data bits (e.g., 1 and 0 for an SLC scheme, or other combinations of bits for other schemes as appropriate). Memory cells having threshold voltages that are not in the overlapping portion of the distributions (between Vra and Vrb) are not represented by hard data. Instead, such cells are represented by soft data.

Specifically, cells represented by hard data (as a result of being in one distribution or the other) may be represented by a soft data bit 0, and cells not represented by hard data (as a result of being in the overlapping portion of the distributions) may be represented by a soft data bit 1. When data is read from the storage medium 104, the hard data and soft data for memory cells to be read are provided to the control circuitry 310 (FIG. 3) and/or the decoder 234 (FIG. 2), where the ECC 224 interprets the soft data cells in order to identify which state they represent.

The hard data streams and soft data streams may be separately processed and provided to the storage controller 102. Since the overlapping areas of neighboring distributions represent a relatively small proportion of the total area of the cell voltage distributions as a whole, soft data streams comprise mostly 0s. As such, soft data streams may be compressed using compression algorithms optimized for streams having sparse 1s, before being transmitted to the storage controller 102.

As discussed above (with reference to FIGS. 2-3), data to be written or read is conveyed across channel 114 via the memory interface 230 when the storage controller 102 writes data to and reads data from the storage medium 104. The interface 230 and channel 114 can be a performance bottleneck in read and write operations, negatively affecting data transmission speeds between the storage controller 102 and the storage medium 104. As such, various techniques for optimizing performance at the interface between the storage controller 102 and the storage medium 104 are described herein.

In some implementations, data to be read from the storage medium 104 may be converted to a format that is optimized for compression, and compressed (e.g., by an encoder in the control circuitry 310 of the storage medium 104 or an encoder 234 of the storage controller 102) before being conveyed to the storage controller 102. In some implementations, the data to be read may be converted to a soft data format (as described above with reference to FIG. 7B).

Since soft data is a sparse vector of mostly logic 0s, soft data is more compressible than hard data, which is usually balanced between logic 0s and logic 1s. Soft data streams can be compressed using, for example, a run-length encoding scheme, which substitutes runs of 0s with symbols designating how many 0s are in the run. In other words, a run-length encoding scheme uses symbols that describe the distance between two 1s.

Figure 8:
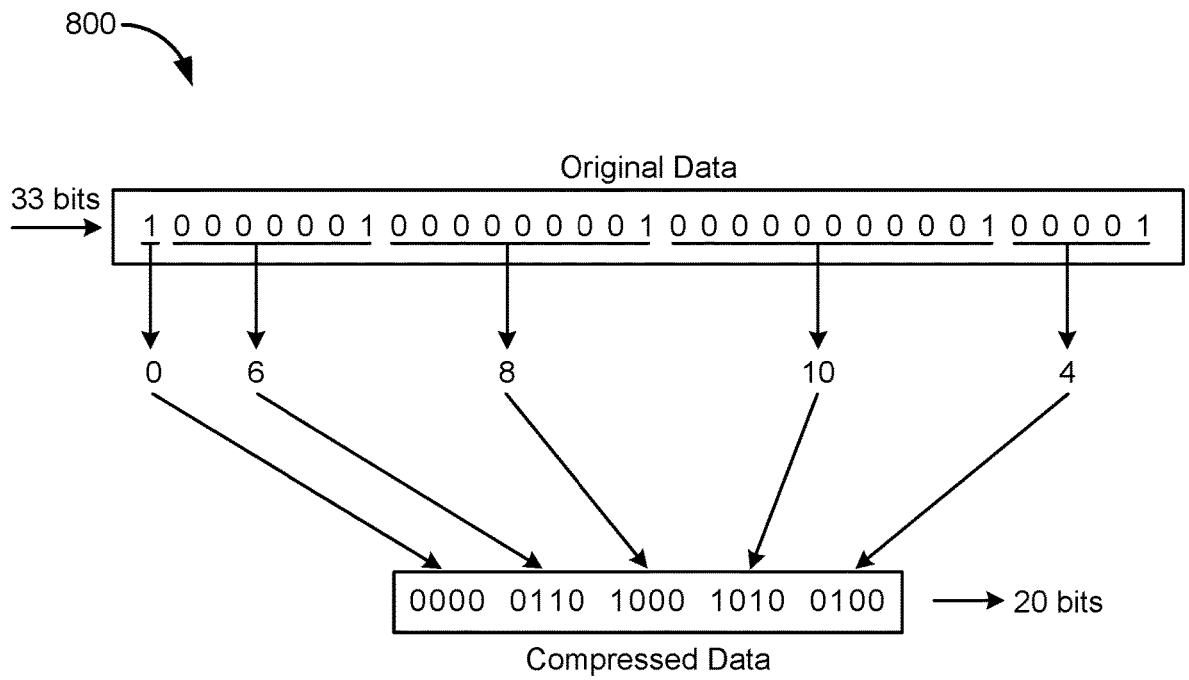
FIG. 8 depicts an example run-length encoding scheme 800 in accordance with some implementations.

FIG. 8 depicts an example run-length encoding scheme 800 in accordance with some implementations. The run-length encoding scheme 800 may be used by the control circuitry 310 (FIG. 3) to compress soft data streams prior to transmitting them to the storage controller 102 via channel 114.

According to the run-length encoding scheme 800, the original soft data may be converted to N-bit symbols (in this example, N=4). Each symbol describes how many 0s appear before a 1. In the example depicted in FIG. 8, zero 0s come before the first 1, so the first 4-bit symbol is 0 (0000). Six 0s come before the next 1, so the next symbol is 6 (0110). Eight 0s come before the next 1, so the next symbol is 8 (1000). Ten 0s come before the next 1, so the next symbol is 10 (1010). Four 0s come before the next 1, so the next symbol is 4 (0100).

The symbols form a compressed data stream that may be conveyed more efficiently across the channel 114, thereby improving performance at the interface between the storage controller 102 and the storage medium 104, and as an extension, improving overall read performance.

Run-length encoding does not always result in compression, however. Even if a soft data stream includes fewer 1s than a hard data stream, the 1s can occur serially or regularly. In a worst case scenario, if 1s are serially or regularly occurring, run-length encoding can result in data expansion instead of data compression.

Figure 9:
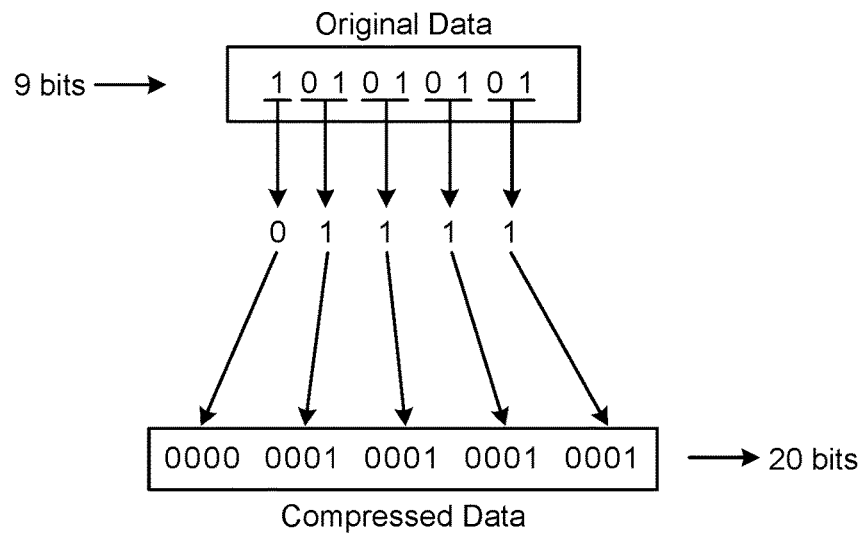
FIG. 9 depicts an example of a run-length encoding scenario (as described above) in which a 9-bit original data stream includes regularly occurring 1s in accordance with some implementations.

FIG. 9 depicts an example of a run-length encoding scenario (as described above) in which a 9-bit original data stream includes regularly occurring 1s in accordance with some implementations. As a result, the run-length encoded ("compressed") data stream is actually an expanded data stream having 20 bits.

Efficacy of run-length encoding schemes (e.g., the compression rate and code length variations) may be affected by symbol bit width. The symbols in FIGS. 8 and 9 are 4-bit symbols (bit width=4). Run-length encoding schemes can use symbols having fewer than 4 bits or more than 4 bits, however. The larger the symbol bit width, the greater the compression rate in best-case scenarios (scenarios in which a data stream includes mostly 0s). However, larger symbol bit widths are also associated with a higher probability of data expansion instead of compression in worst-case scenarios (scenarios in which a data stream includes mostly 1s, such as in FIG. 9).

FIG. 10 depicts relationships between (i) symbol bit width and code length variations for best and worst case scenarios, and (ii) symbol bit width and compression rates in accordance with some implementations. Symbols having 8-bit widths give the best compression rate in the best case, but the variation between best and worst is relatively large. Such variation with 2-bit symbols is less, but the compression rate is also less. As such, 4-bit symbol widths represent a compromise between compression rates and code length variations. Depending on application-specific parameters (e.g., performance and availability of space for an encoder buffer), other bit widths may be optimal. Despite selection of an optimized symbol bit width, the run-length encoding scheme 800 may have relatively large code length variations.

FIG. 11A is an example look up table that the control circuitry 310 may use for performing the encoding scheme 800 in accordance with some implementations. Each 4-bit symbol in the look up table represents the number of 0s preceding a 1 in a soft data stream. Since each symbol is only 4 bits, the maximum number of 0s in a row that may be encoded is 15 (resulting in a symbol of 15, or 1111 in binary). As such, runs of 0s that are greater than 15 are broken up into multiple symbols. For example, a run of 30 zeros may be encoded using two symbols, with each symbol being 15.

FIG. 11B depicts a best-case scenario for the run-length encoding scheme 800 in accordance with some implementations. In this scenario, eighty 0s are encoded into six 4-bit symbols (24 bits). As such, 80 bits are compressed to 24 bits using encoding scheme 800.

FIG. 11C depicts a worst-case scenario for the run-length encoding scheme 800 in accordance with some implementations. In this scenario, eighty 1s are encoded into 80 4-bit symbols (320 bits). As such, 80 bits are expanded to 320 bits.

Figure 12:
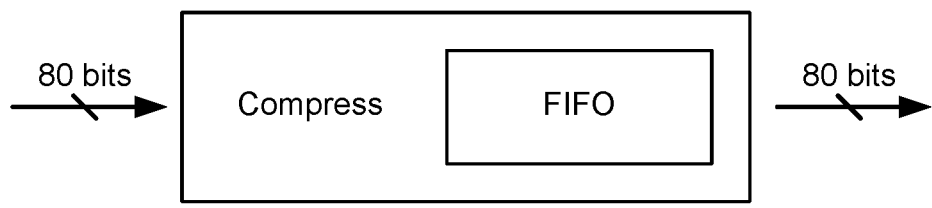
FIG. 12 depicts a first-in-first-out (FIFO) encoding buffer configured to perform soft data compression on a plurality of bits (e.g., eighty bits) in parallel in accordance with some implementations.

FIG. 12 depicts a first-in-first-out (FIFO) encoding buffer configured to perform soft data compression on a plurality of bits (e.g., eighty bits) in parallel in accordance with some implementations. Code length variations, such as the difference between FIGS. 11B and 11C (requiring as little as 24 bits or as much as 320 bits to encode 80 bits of uncompressed soft data) may result in inefficient usage of such an encoding buffer.

Since the input bits arrive in parallel and are compressed to varying numbers of symbols, the FIFO buffer stores the excess bits or symbols until enough data is accumulated to have a continuous data flow at the output. Large code length variations such as those described above may cause the FIFO buffer to be empty (in best-case scenarios) and full (in worst-case scenarios) more frequently than desired for optimal performance. In addition, due to area constraints (the physical space available for the buffer), the buffer may not be big enough to handle the extra symbols involved in worst-case scenarios. Even without area constraints, a buffer with large depth (capacity) may not be fully utilized in best-case scenarios, or in scenarios where 1s are evenly distributed.

Figure 13:
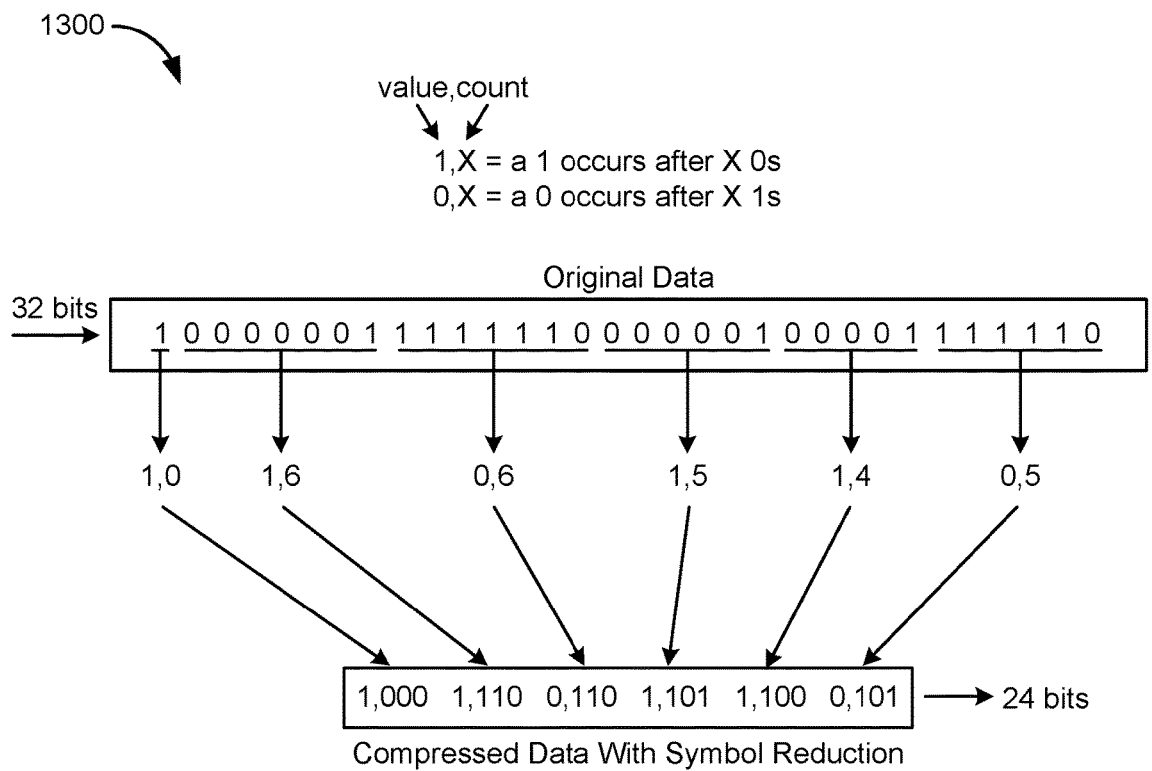
FIG. 13 depicts an example encoding scheme 1300 with symbol reduction in accordance with some implementations.

FIG. 13 depicts an example encoding scheme 1300 with symbol reduction in accordance with some implementations. In some implementations, the encoding scheme 1300 is performed at an encoder of the control circuitry 310 of the storage medium 104 (FIG. 3). In response to a read request by the storage controller 102, the encoder encodes a soft data stream associated with the requested data (as discussed above with reference to FIG. 7B) using the encoding scheme 1300, and transmits the encoded soft data stream to the storage controller 102 via the channel 114 and I/O interface 330.

The encoding scheme 1300 implements a symbol reduction technique that minimizes the code length variations described above by reducing the number of symbols in worst-case scenarios. Each symbol includes two numbers:
a single-bit value number indicating whether the symbol counts 0s or 1s, and
an N-bit count number indicating a bit count associated with the symbol.

The value number may precede the count number, or vice versa. The count number may be N bits, where N is greater than or equal to two. The choice of N may depend on application-specific parameters (e.g., performance and availability of space for an encoder buffer) as described above with reference to the choice of symbol bit width. The following examples use a 3-bit count number (as a result, the symbols have a 4-bit width), and the value number is the most significant bit (MSB) (the value number precedes the count number). These examples are described for illustrative purposes and are not meant to be limiting.

According to the encoding scheme 1300, symbols are encoded using the following rules:
if the value number is 1, the count number indicates after how many 0s there is a 1, and
if the value number is 0, the count number indicates after how many is there is a 0.
Stated another way:
if the value number is 1, a count number X indicates the number of 0s preceding a 1, and
if the value number is 0, a count number X indicates the number of is preceding a 0.
Stated another way:
if the value number is 1, a count number X indicates that a 1 occurs after X 0s, and
if the value number is 0, a count number X indicates that a 0 occurs after X 1s.

Stated yet another way, for a particular symbol (A,B), an A occurs after B Ãs, where A is 0 or 1, B is an N-bit number (N being an integer greater than or equal to 2), and Ã is the complement of A. For example, the six symbols in FIG. 13 indicate the following:
(1,0): a 1 occurs after zero 0s
(1,6): a 1 occurs after six 0s
(0,6): a 0 occurs after six 1s
(1,5): a 1 occurs after five 0s
(1,4): a 1 occurs after four 0s
(0,5): a 0 occurs after five 1s In the example depicted in FIG. 13, a 32-bit stream of original data (e.g., soft data, as described above) is compressed to a 24-bit output stream (six four-bit symbols).

Figure 14:
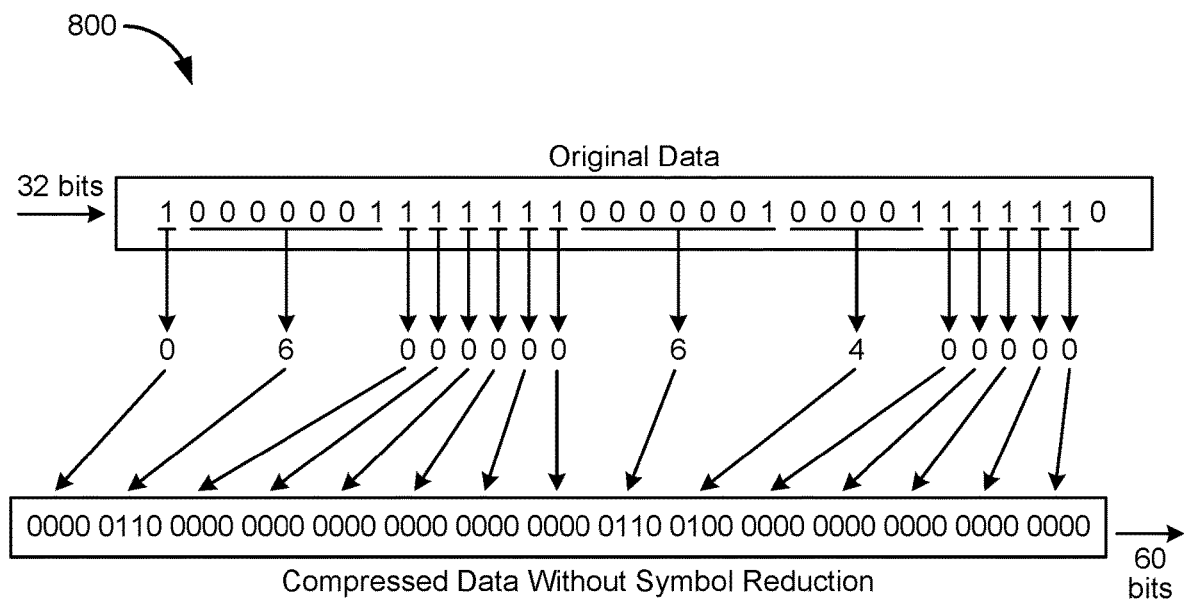
FIG. 14 depicts the example data stream of FIG. 13 encoded using the scheme 800 described in FIG. 8 in accordance with some implementations.

FIG. 14 depicts the example data stream of FIG. 13 encoded using the scheme 800 described in FIG. 8 in accordance with some implementations. Encoding the same 32-bit stream of original data using the encoding scheme 800 would result in a 60-bit stream (fifteen four-bit symbols). As such, the symbol reduction method of encoding scheme 1300 results in a higher compression rate (24-bit output stream for scheme 1300 vs. 60-bit output stream for scheme 800).

FIG. 15 is an example lookup table 1500 for use by an encoder configured to perform the encoding scheme 1300 in accordance with some implementations. A lookup table with 8-bit input raw data can have 256 input combinations and accordingly 256 unique output symbols. Such a table may require a prohibitive amount of area. On the other hand, a lookup table with 4-bit input raw data can have 16 input combinations and accordingly 16 unique output symbols. Such a table would require much less area to implement, and is therefore used as an example table configuration for the following discussion. Such a configuration, however, is described for illustrative purposes and is not meant to be limiting.

The encoder conveys symbols corresponding to 4-bit input raw data as output to the channel 114 as follows. Each of the 16 input combinations in the lookup table 1500 corresponds to two symbols.

Symbols labeled with Flag=X are not used (not conveyed by the encoder as output).

Symbols labeled with Flag=1 are final symbols and are directly conveyed by the encoder as output without any further adjustments. Finals symbols (associated with flag=1) are interpreted by the encoder as described above. Specifically, (0,X) means a 0 occurs after X 1s, and (1,X) means a 1 occurs after X 0s, where X greater than or equal to 0.

Symbols labeled with Flag=0 are intermediate symbols and are not directly conveyed by the encoder as output. Instead, an intermediate symbol is clubbed (combined) with the next symbol to determine the final compressed symbol. For clubbing with the intermediate symbol, the next symbol can be an intermediate symbol or a final symbol. Successive intermediate symbols are clubbed until a final symbol is reached. Intermediate symbols (associated with flag=0) are interpreted by the encoder as indicating a count of the value number. Specifically, (0,X) means there are X 0s, and (1,X) means there are X 1s, where X greater than or equal to 0.

Figure 16A:
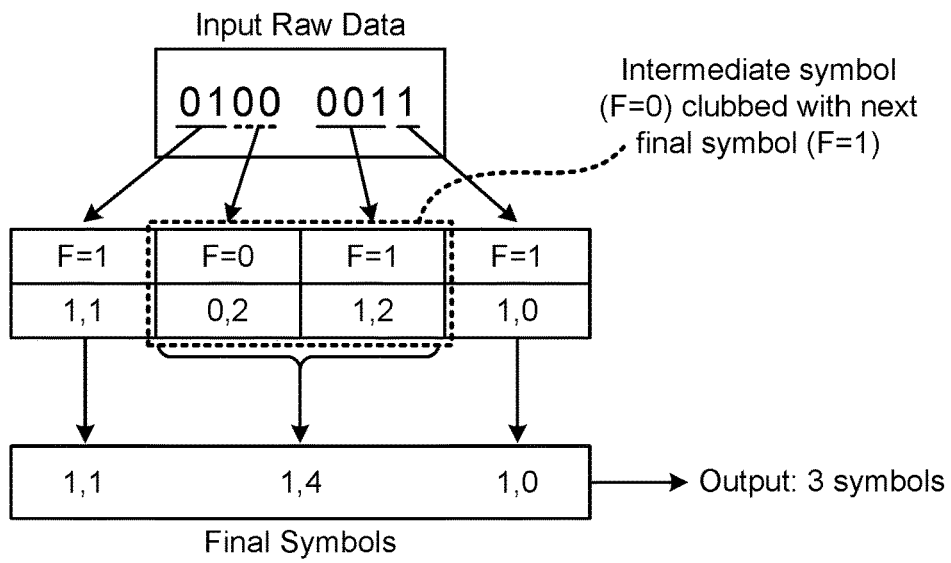
FIG. 16A is a diagram of a first encoding example using the lookup table 1500 in accordance with some implementations.

FIG. 16A is a diagram of a first encoding example using the lookup table 1500 in accordance with some implementations. An input data stream of 0100 0011 is received at the encoder. For the first 4 bits of input data (0100), the encoder uses the lookup table 1500 to match (map) the 4-bit input with two symbols: (1,1) (final, denoted by F=1) and (0,2) (intermediate, denoted by F=0). For the next 4 bits of input data (0011), the encoder uses the lookup table 1500 to match the 4-bit input with two symbols: (1,2) (final) and (1,0) (final).

At this point, there are four symbols. The encoder outputs the first symbol (1,1) as it is a final symbol. Since the second symbol (0,2) is an intermediate symbol, the encoder clubs the second symbol with the third symbol (1,2). The second symbol (0,2) indicates two 0s, and the third symbol (1,2) indicates a 1 after two 0s. Clubbing the two symbols together leads to a single symbol (1,4) indicating a 1 after four 0s. The encoder outputs this symbol as a second final symbol.

Since the fourth initial signal (1.0) is a final symbol, the encoder outputs the fourth symbol as the third output symbol. As a result of the encoding scheme 1300, the encoder outputs three final symbols. An encoder performing the encoding scheme 800 (FIG. 8) would have also outputted three symbols (1,4,0). Therefore, in this example, the number of output symbols is the same with or without use of the symbol reduction method of encoding scheme 1300.

Figure 16B:
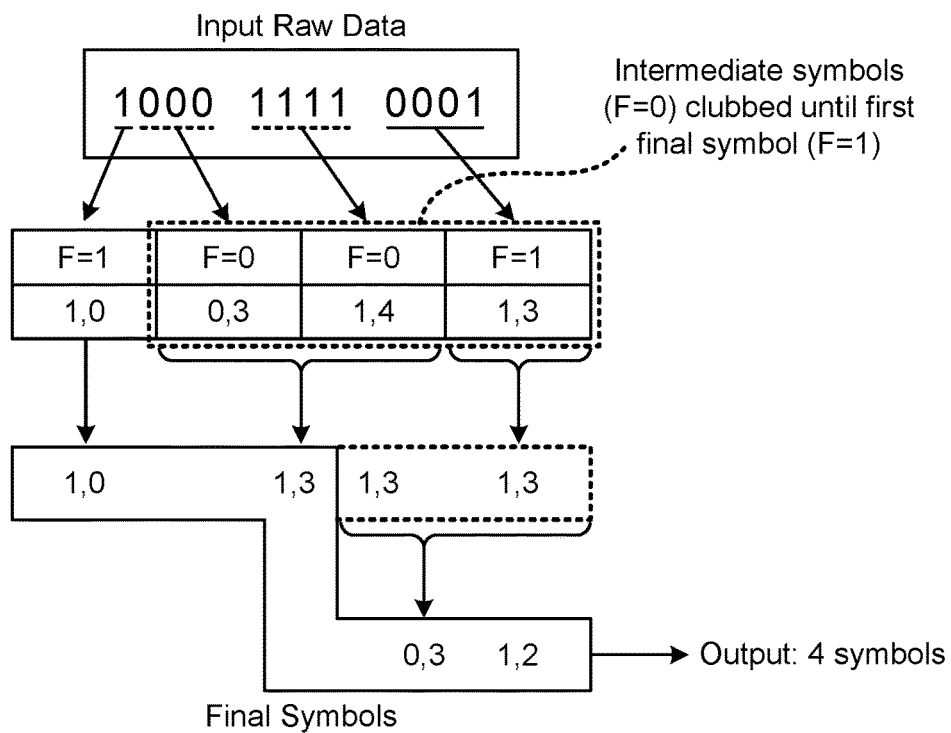
FIG. 16B is a diagram of a second encoding example using the lookup table 1500 in accordance with some implementations

FIG. 16B is a diagram of a second encoding example using the lookup table 1500 in accordance with some implementations. An input data stream of 1000 1111 0001 is received at the encoder. For the first 4 bits of input data (1000), the encoder uses the lookup table 1500 to match the 4-bit input with two symbols: (1,0) (final) and (0,3) (intermediate). The encoder uses the lookup table 1500 to match the next 4-bit input (1111) to one symbol (1,4) (intermediate), and uses the lookup table 1500 to match the next 4-bit input (0001) to one symbol (1,3) (final).

The encoder conveys the first symbol (1,0) as output, since it is a final symbol. Since the second and third symbols are intermediate, the encoder clubs the second and third symbols with the fourth symbol in order to determine the next final symbol. Even though the fourth symbol (1,3) was flagged as final, the encoder does not convey this symbol since the bits are clubbed with bits in a preceding intermediate symbol.

The clubbed bits are 00011110001. In processing clubbed bits, the encoder may use the lookup table 1500 again to match each 4-bit input with corresponding symbols. Alternatively, the encoder may include circuitry configured to combine different combinations of clubbed symbols into one or more final symbols.

The first four clubbed bits, 0001, map to the final symbol (1,3). The encoder conveys this symbol as the second output symbol, since it is a final symbol.

The next four clubbed bits, 1110, map to the final symbol (0,3). The encoder conveys this symbol as the third output symbol, since it is a final symbol.

The next clubbed bits are 001. Input bits that do not add up to 4 may be appended with one or more trailing zeros in order to add up to 4 (making the last clubbed bits 0010). Bits 0010 map to the final symbol (1,2). The encoder conveys this symbol as the fourth output symbol, since it is a final symbol.

As a result of the encoding scheme 1300, the encoder outputs four final symbols. An encoder performing the encoding scheme 800 (FIG. 8) would have also outputted six symbols (0,3,0,0,0,3). Therefore, in this example, the symbol reduction method of the encoding scheme 1300 has a higher compression rate due to having outputted fewer symbols.

FIG. 17 is a table highlighting tradeoffs between code length variation (between best and worst case) and compression rates in accordance with some implementations. A FIFO buffer design having minimum depth and minimum symbol variation between the best and the worst case scenarios may be desired in order to avoid frequent FIFO full and FIFO empty cases. Encoding a soft data stream using scheme 1300 (with symbol reduction) optimizes compression in light of the aforementioned factors (minimum depth and minimum symbol variation).

A 4-bit symbol without symbol reduction has maximum symbol variation of 93.32%, which may not lend itself to an adequate FIFO buffer design for the reasons discussed above (frequent FIFO full and FIFO empty cases). A 2-bit symbol without symbol reduction has the least symbol variation (66.68%) but also the lowest best case compression rate (33.38%)

A 4-bit symbol with symbol reduction gives better compression (42.86%) than 2-bit symbols without symbol reduction (33.38%), and has a lower maximum symbol variation (71.43%) compared to 4-bit symbols without symbol reduction (93.32%). Thus, there is a tradeoff between variation and compression rate. Accordingly, for applications where compression is crucial with less symbol variation, the use of 4-bit symbols with symbol reduction may be the most efficient implementation.

Upon applying the symbol reduction method of the encoding scheme 1300, the encoder transmits the encoded symbols to the storage controller 102 via the channel 114 and I/O interface 330 (FIG. 3). In some implementations, a decoder 234 at the storage controller 102 (FIG. 2) decodes the encoded symbols to recover the raw data for reading.

Figure 18:
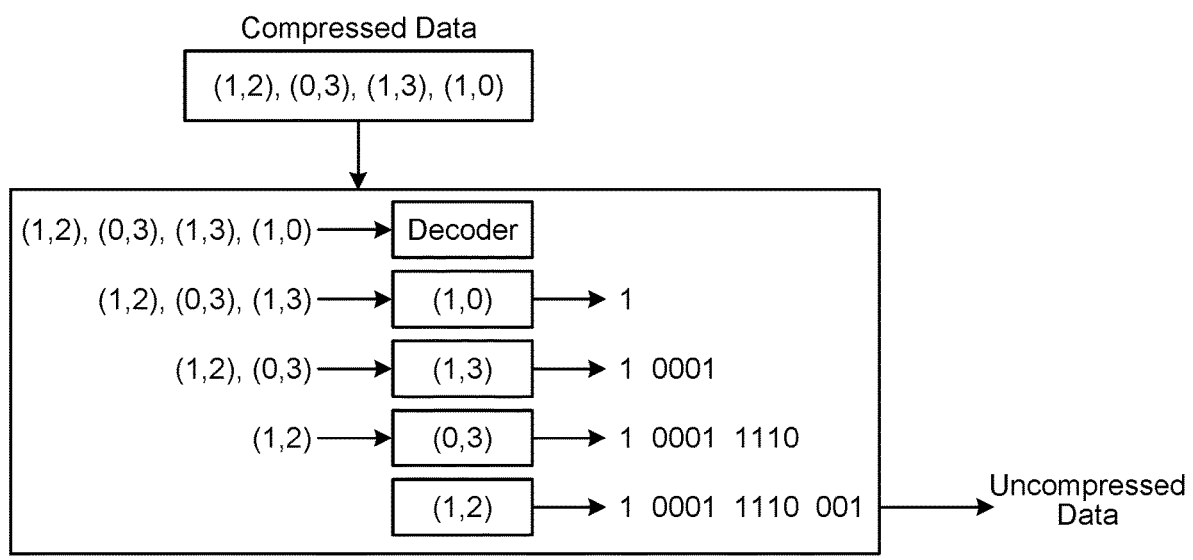
FIG. 18 is a diagram of an example decoding process in accordance with some implementations.

FIG. 18 is a diagram of an example decoding process in accordance with some implementations. For each successive symbol received at the decoder, the decoder generates 4 bits of data using the value number and the count number of the received symbol. The decoder inserts the value number (a 0 or 1) after a run of bits having a length specified by the count number and values equal to the complement of the value number. For example, the decoder generates the following:
1 based on the (1,0) symbol (a 1 occurring after zero 0s)
0001 based on the (1,3) symbol (a 1 occurring after three 0s)
1110 based on the (0,3) symbol (a 0 occurring after three 1s)
001 based on the (1,2) symbol (a 1 occurring after two 0s)

The decoder proceeds to convey the decoded soft data stream (10011110001) to the ECC 224 for matching with corresponding hard data and outputting resulting data to the host as part of a requested read operation.

It will be appreciated by those skilled in the art that changes could be made to the exemplary embodiments shown and described above without departing from the broad inventive concept thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention, different components as opposed to those specifically mentioned may perform at least some of the features described herein, and features of the disclosed embodiments may be combined. As used herein, the terms "about" and "approximately" may refer to + or −10% of the value referenced. For example, "about 9" is understood to encompass 8.2 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

As used herein, the term "if" may be, optionally, construed to mean "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

Further, to the extent that the method does not rely on the particular order of steps set forth herein, the particular order of the steps should not be construed as limitation on the claims. The claims directed to the method of the present invention should not be limited to the performance of their steps in the order written, and one skilled in the art can readily appreciate that the steps may be varied and still remain within the spirit and scope of the present invention.

What is claimed is:

1. A data storage system, comprising:
   a storage medium including a plurality of memory cells and an encoder;
   a storage controller in communication with the storage medium; and
   electrical interface circuitry configured to transfer data via a channel disposed between the storage medium and the storage controller;
   wherein the encoder of the storage medium is configured to:
      receive data subject to a read operation specified by the storage controller;
      encode the data subject to the read operation including generating a plurality of symbols representing a soft data stream corresponding to the data subject to the read operation, wherein each symbol of the plurality of symbols representing the soft data stream includes:
         (i) a single-bit value number indicating whether the symbol counts 0s or 1s, and
         (ii) an N-bit count number indicating a bit count associated with the symbol, where N is greater than or equal to two; and
      convey the plurality of generated symbols to the storage controller via the electrical interface circuitry.

2. The data storage system of claim 1, wherein for each symbol of the plurality of symbols:
   if the value number is 1, the count number indicates a number of 0s preceding a 1; and
   if the value number is 0, the count number indicates a number of is preceding a 0.

3. The data storage system of claim 1, wherein the encoder is configured to generate symbols for a plurality of combinations of N+1 bits of the data subject to the read operation based on a lookup table stored at the storage medium.

4. The data storage system of claim 3, wherein the lookup table respectively maps each combination of N+1 bits to two symbols.

5. The data storage system of claim 3, wherein the lookup table maps:
   at least one of the plurality of combinations of N+1 bits to an intermediate symbol and a final symbol; and
   at least one of the plurality of combinations of N+1 bits to two final symbols in the lookup table.

6. The data storage system of claim 5, wherein the encoder is configured to combine an intermediate symbol of one of the plurality of combinations of N+1 bits with a final symbol of another of the plurality of combinations of N+1 bits before conveying the plurality of generated symbols to the storage controller.

7. The data storage system of claim 1, wherein the storage controller includes a decoder configured to:
   receive the plurality of generated symbols; and
   for each symbol of the plurality of generated symbols, output:
      (i) a single bit specified by the value number, and
      (ii) N bits specified by the count number, preceding the single bit, and having values that are complementary to that of the single bit.

8. A method of operating a data storage system, comprising:
   at an encoder of a storage medium of the data storage system:
      receiving data subject to a read operation specified by a storage controller of the data storage system;
      encoding the data subject to the read operation including generating a plurality of symbols representing a soft data stream corresponding to the data subject to the read operation, wherein each symbol of the plurality of symbols representing the soft data stream includes:
         (i) a single-bit value number indicating whether the symbol counts 0s or 1s, and
         (ii) an N-bit count number indicating a bit count associated with the symbol, where N is greater than or equal to two; and
      conveying the plurality of generated symbols to the storage controller.

9. The method of claim 8, wherein for each symbol of the plurality of symbols:
   if the value number is 1, the count number indicates a number of 0s preceding a 1; and
   if the value number is 0, the count number indicates a number of is preceding a 0.

10. The method of claim 8, wherein the encoder is configured to generate symbols for a plurality of combinations of N+1 bits of the data subject to the read operation based on a lookup table stored at the storage medium.

11. The method of claim 10, wherein the lookup table respectively maps each combination of N+1 bits to two symbols.

12. The method of claim 10, wherein the lookup table maps:
   at least one of the plurality of combinations of N+1 bits to an intermediate symbol and a final symbol; and
   at least one of the plurality of combinations of N+1 bits to two final symbols in the lookup table.

13. The method of claim 12, wherein the method includes combine, at the encoder, an intermediate symbol of one of the plurality of combinations of N+1 bits with a final symbol of another of the plurality of combinations of N+1 bits before conveying the plurality of generated symbols to the storage controller.

14. The method of claim 8, further comprising, at a decoder of the storage controller:
   receiving the plurality of generated symbols; and
   for each symbol of the plurality of generated symbols, outputting:
      (i) a single bit specified by the value number, and
      (ii) N bits specified by the count number, preceding the single bit, and having values that are complementary to that of the single bit.

15. A data storage system, comprising:
   means for receiving data subject to a read operation specified by a storage controller of the data storage system;
   means for encoding the data subject to the read operation including means for generating a plurality of symbols representing a soft data stream corresponding to the data subject to the read operation, wherein each symbol of the plurality of symbols representing the soft data stream includes:
      (i) a single-bit value number indicating whether the symbol counts 0s or 1s, and
      (ii) an N-bit count number indicating a bit count associated with the symbol, where N is greater than or equal to two; and
   means for conveying the plurality of generated symbols to the storage controller.

16. The data storage system of claim 15, wherein for each symbol of the plurality of symbols:
   if the value number is 1, the count number indicates a number of 0s preceding a 1; and
   if the value number is 0, the count number indicates a number of is preceding a 0.

17. The data storage system of claim 15, wherein the means for encoding include means for generating symbols for a plurality of combinations of N+1 bits of the data subject to the read operation based on a lookup table stored at the storage medium.

18. The data storage system of claim 17, wherein the lookup table respectively maps:
   each combination of N+1 bits to two symbols;
   at least one of the plurality of combinations of N+1 bits to an intermediate symbol and a final symbol; and
   at least one of the plurality of combinations of N+1 bits to two final symbols in the lookup table.

19. The data storage system of claim 18, wherein the means for encoding include means for combining an intermediate symbol of one of the plurality of combinations of N+1 bits with a final symbol of another of the plurality of combinations of N+1 bits before conveying the plurality of generated symbols to the storage controller.

20. The data storage system of claim 15, further comprising:
   means for receiving the plurality of generated symbols at the storage controller; and
   means for outputting, for each symbol of the plurality of generated symbols:
      (i) a single bit specified by the value number, and
      (ii) N bits specified by the count number, preceding the single bit, and having values that are complementary to that of the single bit.

* * * * *